US012761562B2

(12) United States Patent
Ho et al.

(10) Patent No.: US 12,761,562 B2
(45) Date of Patent: Oct. 13, 2026

(54) UNDERLAYER COMPOSITION AND METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: Chun-Chih Ho, Taichung City (TW); Chin-Hsiang Lin, Hsinchu (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 505 days.

(21) Appl. No.: 16/952,023

(22) Filed: Nov. 18, 2020

(65) Prior Publication Data

US 2021/0200091 A1 Jul. 1, 2021

Related U.S. Application Data

(60) Provisional application No. 62/956,010, filed on Dec. 31, 2019.

(51) Int. Cl.

| | |
|---|---|
| ***G03F 7/11*** | (2006.01) |
| ***C09D 183/04*** | (2006.01) |
| ***H10P 76/20*** | (2026.01) |

(52) U.S. Cl.

CPC .............. *G03F 7/11* (2013.01); *C09D 183/04* (2013.01); *H10P 76/2041* (2026.01)

(58) Field of Classification Search

CPC .......... G03F 7/11; G03F 7/0757; G03F 7/091; G03F 7/38; G03F 7/095; G03F 1/76; G03F 1/46; G03F 1/56; G03F 7/2004; C09D 183/04; H01L 21/0274; H01L 21/0275; H01L 21/0271; H10P 76/2041

See application file for complete search history.

(56) References Cited

U.S. PATENT DOCUMENTS

| | | | | |
|---|---|---|---|---|
| 5,415,935 | A | 5/1995 | Pankratz | |
| 5,663,036 | A * | 9/1997 | Conley | G03F 7/09 430/167 |
| 9,248,693 | B2 * | 2/2016 | Ogihara | G03F 7/09 |
| 9,768,022 | B2 * | 9/2017 | Weng | G03F 7/40 |

(Continued)

OTHER PUBLICATIONS

Yamashita, et al., "Degradation of sulfur-containing aromatic polymers: Photodegradation of polyethersulfone and polysulfone", Polymer Degradation and Stability 39, 47-54 (1993) (Year: 1993).*

(Continued)

*Primary Examiner* — Mark F. Huff
*Assistant Examiner* — Alexander N. Lee
(74) *Attorney, Agent, or Firm* — STUDEBAKER BRACKETT PLLC

(57) ABSTRACT

A method of manufacturing a semiconductor device includes forming a photoresist underlayer over a semiconductor substrate. The underlayer includes a polymer having a photocleavable functional group. A photoresist layer is formed over the underlayer. The photoresist layer is selectively exposed to actinic radiation, and the selectively exposed photoresist layer is developed to form a photoresist pattern.

20 Claims, 17 Drawing Sheets

(56) References Cited

U.S. PATENT DOCUMENTS

| | | | | |
|---|---|---|---|---|
| 2002/0095007 | A1* | 7/2002 | Larock | C08F 220/64 524/518 |
| 2005/0111781 | A1* | 5/2005 | Jain | G02B 6/43 385/47 |
| 2008/0156212 | A1 | 7/2008 | Yamada et al. | |
| 2008/0171293 | A1* | 7/2008 | Dunn | G03F 7/203 430/323 |
| 2008/0199789 | A1* | 8/2008 | Abdallah | H01L 21/02126 430/21 |
| 2009/0035557 | A1* | 2/2009 | Hartmann | F28D 20/023 428/323 |
| 2012/0034419 | A1* | 2/2012 | Washburn | G03F 7/091 427/523 |
| 2012/0122029 | A1* | 5/2012 | Kudo | G03F 7/095 430/325 |
| 2015/0159045 | A1 | 6/2015 | Kanno et al. | |
| 2015/0203977 | A1* | 7/2015 | Luca | C25B 1/04 204/290.01 |
| 2015/0210829 | A1 | 7/2015 | Shibayama et al. | |
| 2015/0221881 | A1 | 8/2015 | Iwai et al. | |
| 2016/0090511 | A1* | 3/2016 | Masuda | C08L 53/00 428/328 |
| 2016/0211142 | A1 | 7/2016 | Kim et al. | |
| 2017/0213722 | A1* | 7/2017 | Weng | G03F 7/322 |
| 2019/0077988 | A1* | 3/2019 | Yan | C09D 7/00 |
| 2021/0364922 | A1* | 11/2021 | Chen | H01L 21/0274 |

OTHER PUBLICATIONS

Ranby, et al., "Photodegradation, Photo-oxidation and Photostabilization of Polymers", Principles and Applications, John Wiley and Sons, London, 223-227 (1975) (Year: 1975).*

Yun Ru Huang et al., "Polymer nanocomposite films with extremely high nanoparticle loadings via capillary rise infiltration (CaRI)," Nanoscale, vol. 7, pp. 798-805 (2015).

Andrew K. Whittaker et al., "Development of polymers for non-CAR resists for EUV lithography," Proc. SPIE 7273, Advances in Resist Materials and Processing Technology XXVI, 727321 (Apr. 1, 2009); doi: 10.1117/12.820493.

"Polycarbonate," https://www.chemicalbook.com/ChemicalProductProperty_EN_CB6236571.htm> (Year: 2024).

* cited by examiner

Polysulfone poly(4-hydroxystyrene)
PHS
MW 3600 Tg 122C
MW 5000 Tg 137C
MW >8000 Tg 176C Organic underlayer poly(4-hydroxystyrene)

Poly(4-vinylphenol-co-methyl methacrylate)

Poly(styrene)-b-poly(4-hydroxystyrene)

Inorganic underlayer

Polysiloxane derivatives

UNDERLAYER COMPOSITION AND METHOD OF MANUFACTURING A SEMICONDUCTOR DEVICE

CROSS-REFERENCE TO RELATED APPLICATION

This application claims priority to U.S. Provisional Patent Application No. 62/956,010, filed Dec. 31, 2019, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

polymers with photocleavable functional groups according to embodiments of the disclosure.

Figure 9:
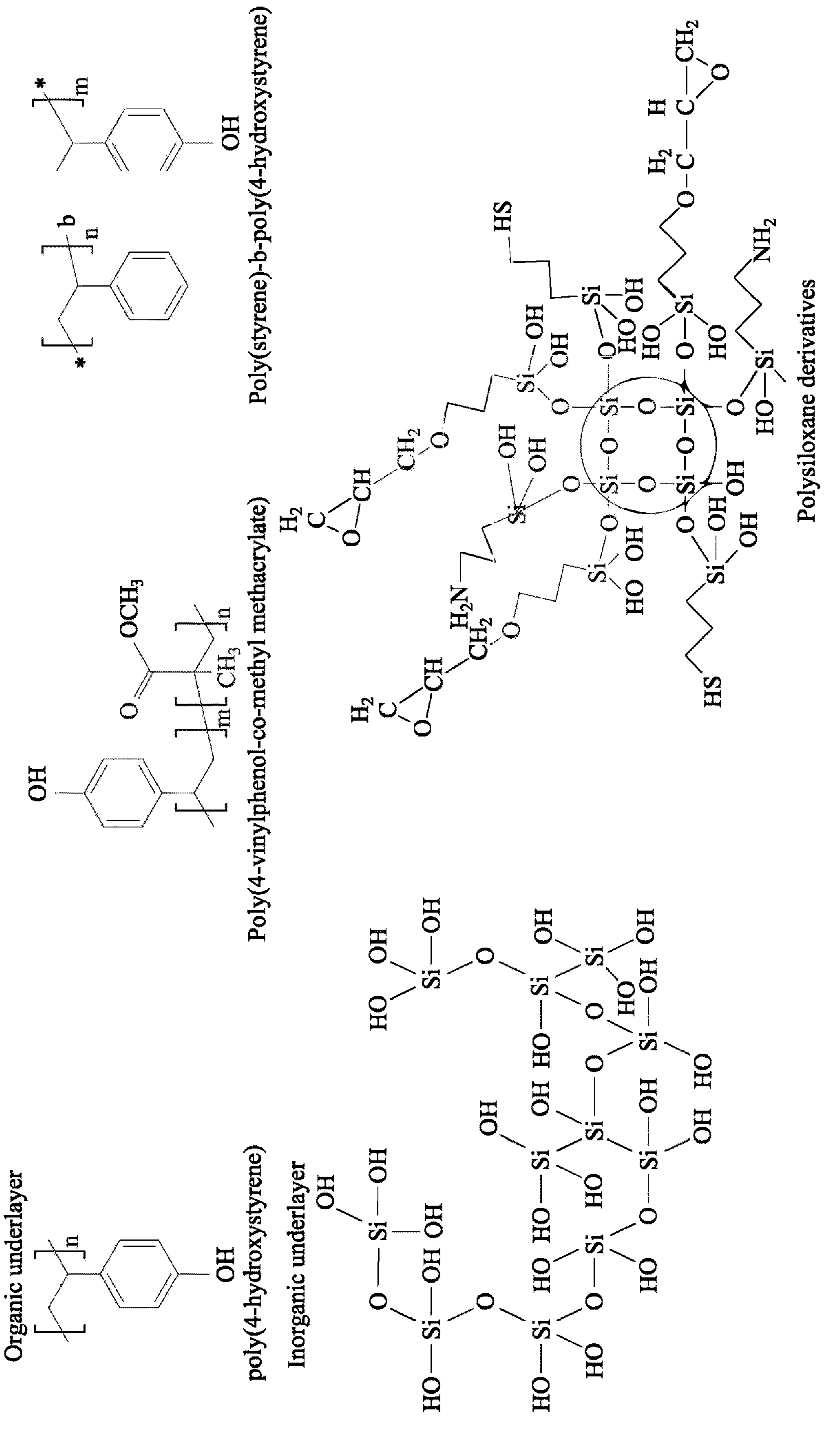

FIG. 9 illustrates components of underlayer compositions according to embodiments of the disclosure.

Figure 10:
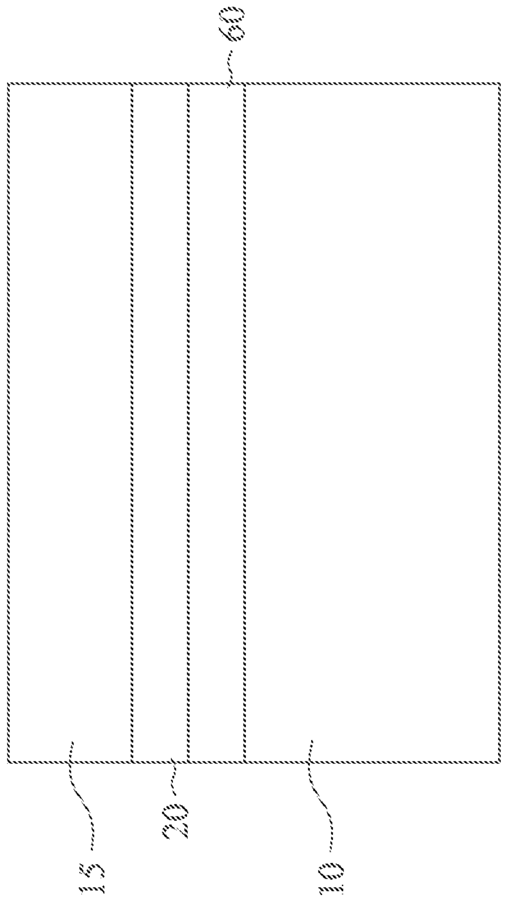

FIG. 10 shows a process stage of a sequential operation according to an embodiment of the disclosure.

Figure 11A:
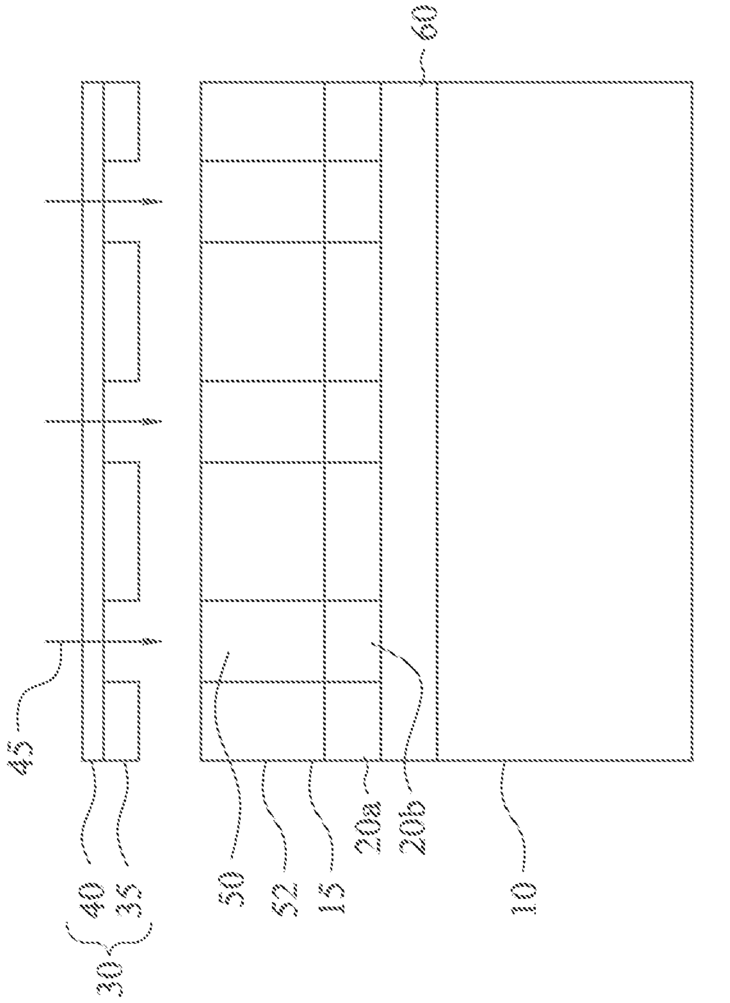
Figure 11B:
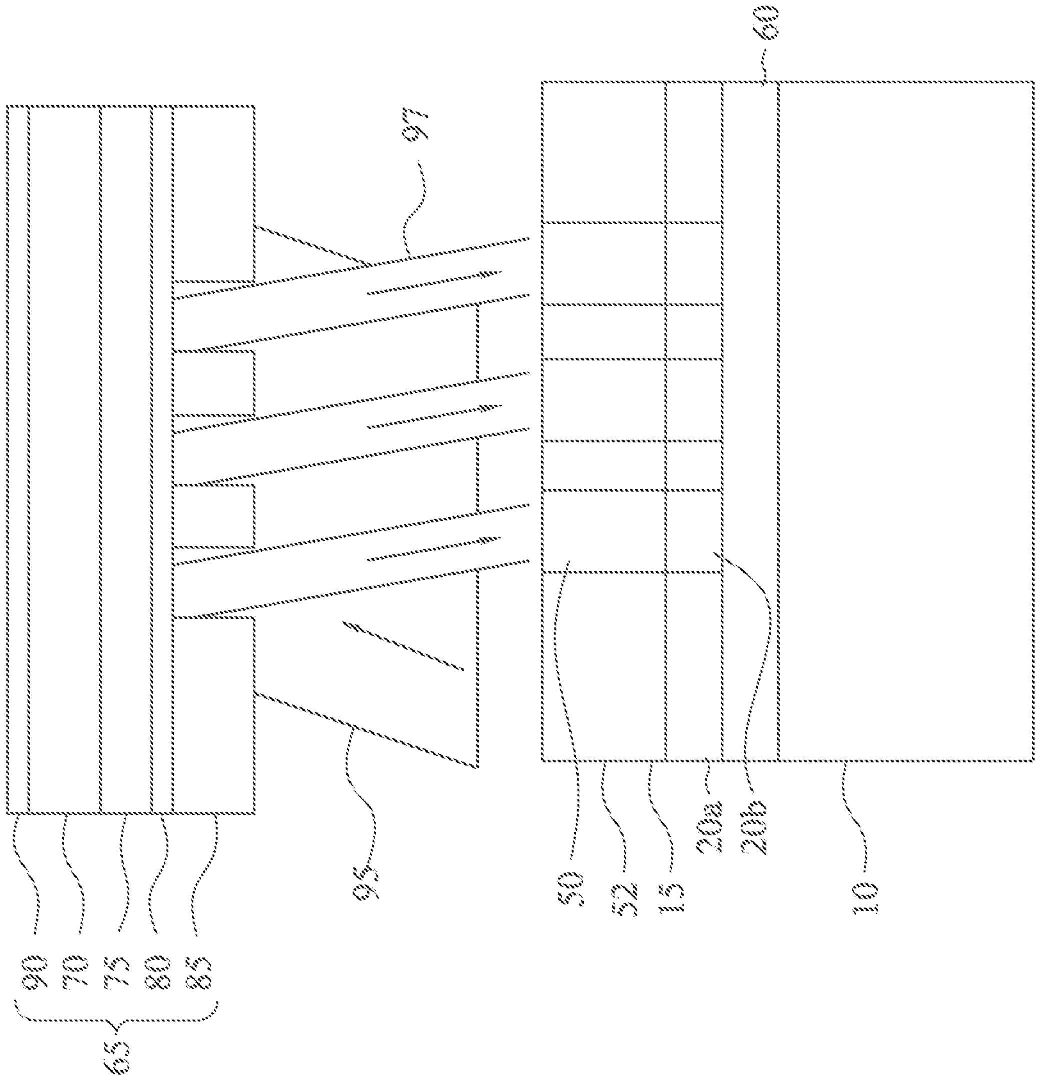

FIGS. 11A and 11B show a process stage of a sequential operation according to embodiments of the disclosure.

Figure 12:
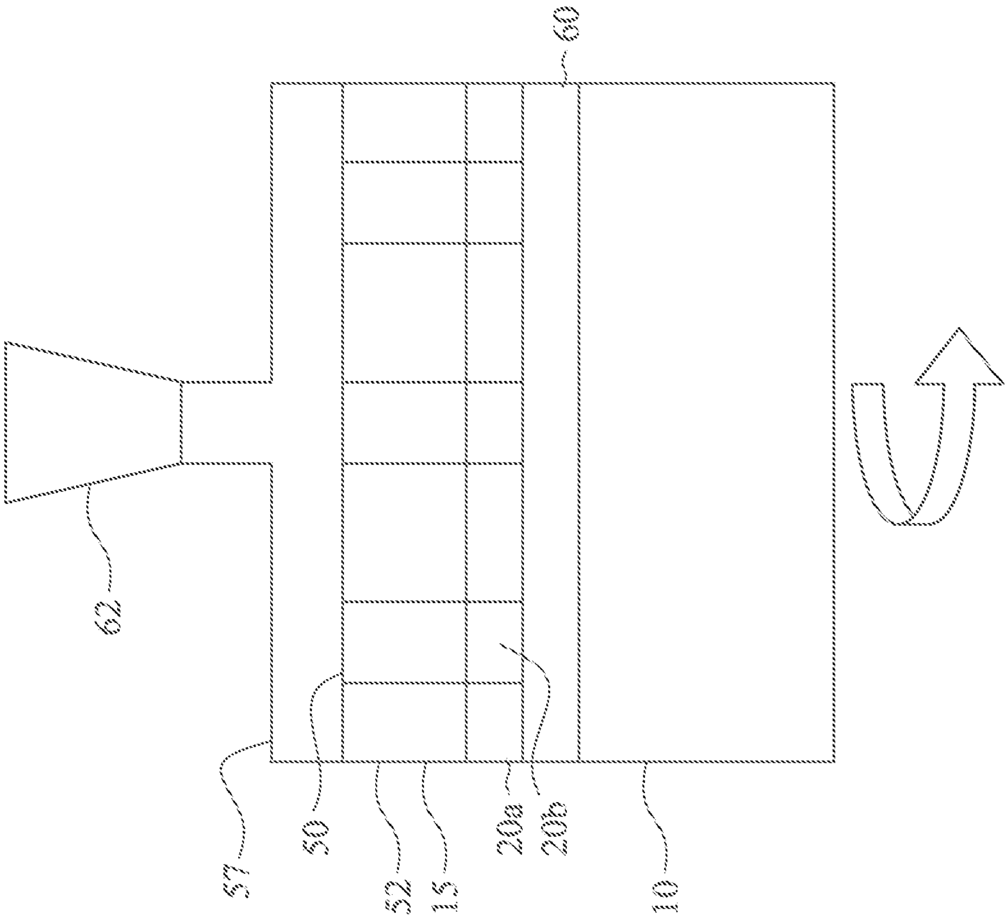

FIG. 12 shows a process stage of a sequential operation according to an embodiment of the disclosure.

Figure 13:
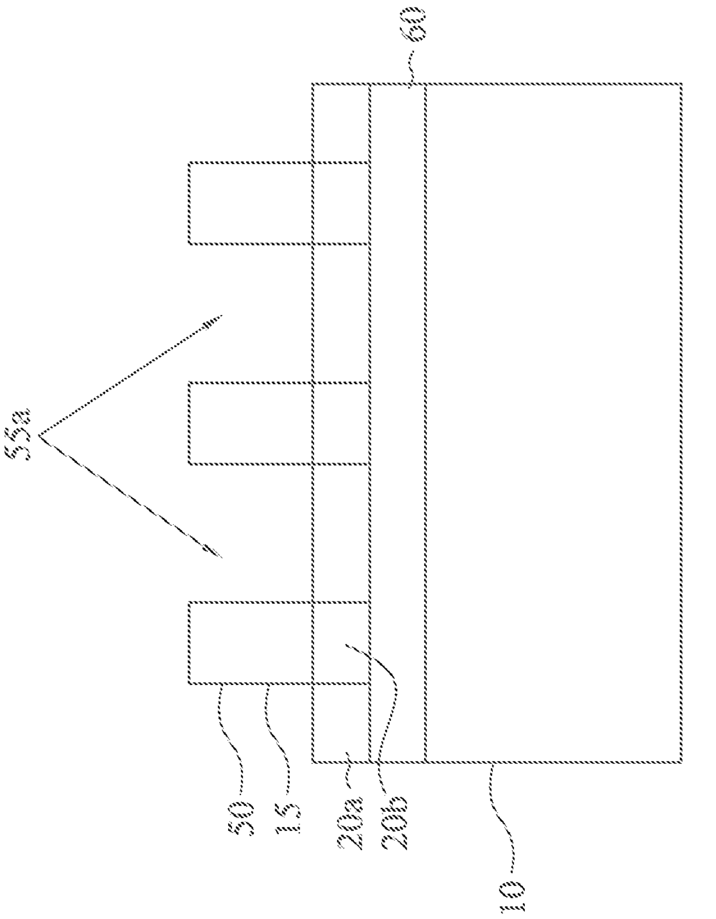

FIG. 13 shows a process stage of a sequential operation according to an embodiment of the disclosure.

Figure 14:
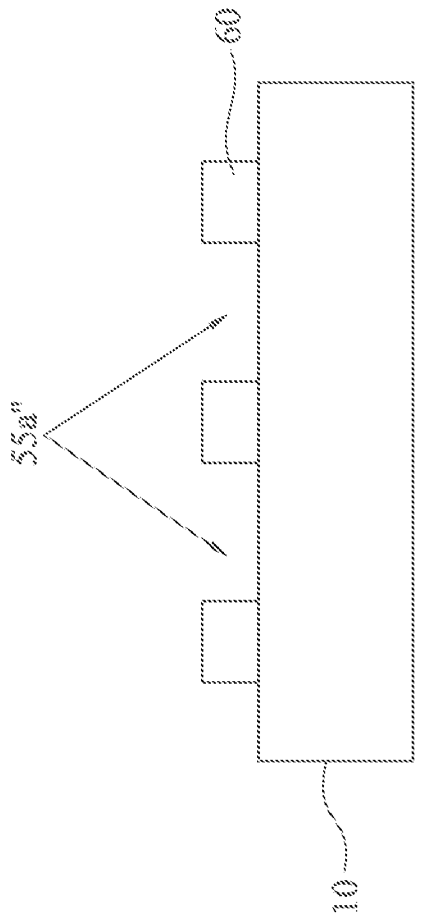

FIG. 14 shows a process stage of a sequential operation according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Extreme ultraviolet (EUV) lithography to achieve sub-20 nm half-pitch resolution is under development for mass production for next generation sub 5 nm node. EUV lithography requires a high performance photoresist with high sensitivity for cost reduction of the high-power exposure source, and to provide good resolution of the image. Metallic resists have been developed that provide high sensitivity and good resolution. However, pattern collapse and pattern scum may occur due to the reaction mechanism and higher interaction between the resist and a resist underlayer. Embodiments of this disclosure provide improved adhesion of the photoresist pattern to the substrate thereby preventing pattern collapse while preventing pattern scum.

Figure 1:
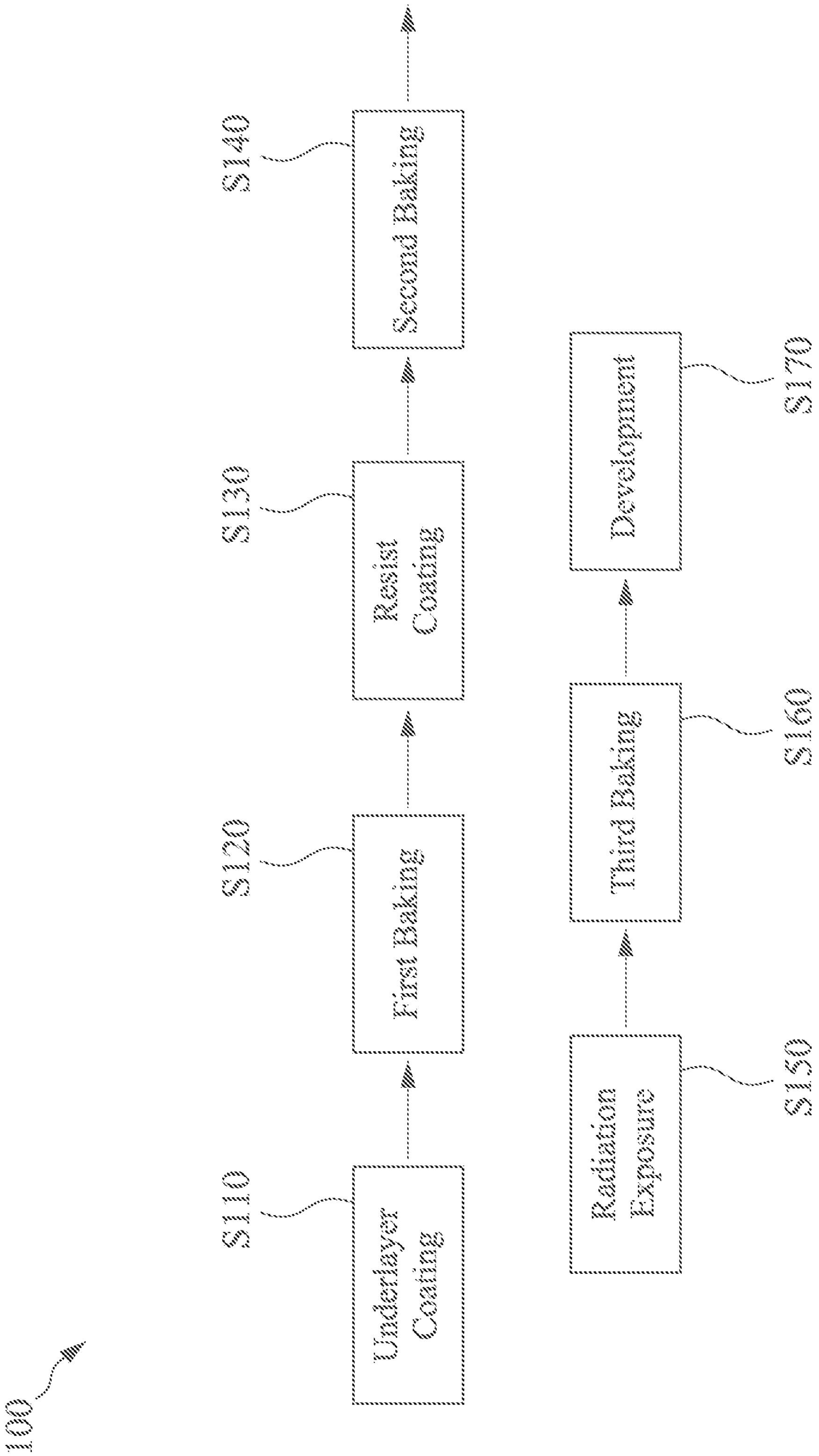
FIG. 1 illustrates a process flow of manufacturing a semiconductor device according to embodiments of the disclosure.
Figure 2:
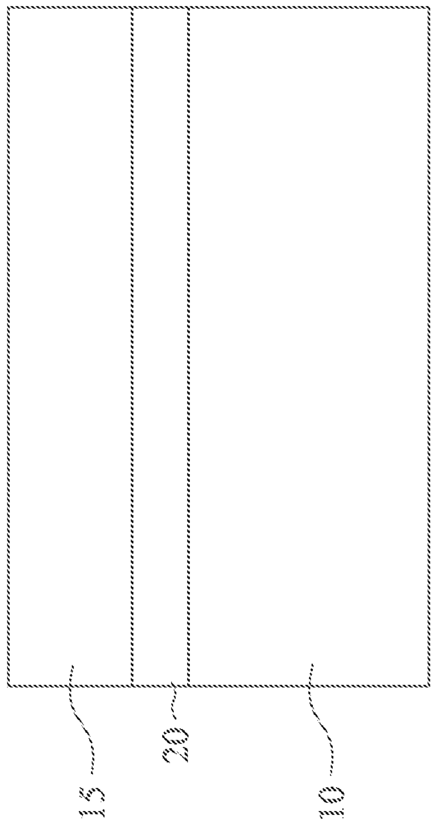
FIG. 2 shows a process stage of a sequential operation according to an embodiment of the disclosure.

FIG. 1 illustrates a process flow 100 of manufacturing a semiconductor device according to embodiments of the disclosure. A resist underlayer composition is coated on a surface of a layer to be patterned or a substrate 10 in operation S110, in some embodiments, to form a resist underlayer 20, as shown in FIG. 2. In some embodiments, the resist underlayer 20 has a thickness ranging from about 2 nm to about 300 nm. In some embodiments, the resist underlayer has a thickness ranging from about 20 nm to about 100 nm. Then the resist underlayer 20 undergoes a first baking operation S120 to evaporate solvents in the underlayer composition in some embodiments. The underlayer 20 is baked at a temperature and time sufficient to cure and dry the underlayer 20. In some embodiments, the underlayer is heated at a temperature of about 40° C. and 300° C. for about 10 seconds to about 10 minutes. In some embodiments, the underlayer is heated at a temperature ranging from about 80° C. to about 200° C. The first baking causes the underlayer polymer composition to crosslink in some embodiments.

A resist layer composition is subsequently coated on a surface of the resist underlayer 20 in operation S130, in some embodiments, to form a resist layer 15, as shown in FIG. 2. In some embodiments, the resist layer 15 is a photoresist layer. Then the resist layer 15 undergoes a second baking operation S140 (or pre-baking operation) to evaporate solvents in the resist composition in some embodiments. The resist layer 15 is baked at a temperature and time sufficient to cure and dry the photoresist layer 15. In some embodiments, the resist layer is heated at a temperature of about 40° C. and 120° C. for about 10 seconds to about 10 minutes. In some embodiments, the resist layer composition is coated on the resist underlayer 20 prior to baking the resist underlayer 20, and the resist layer 15 and resist underlayer 20 are baked together in a single baking operation to drive off solvents of both layers and cause crosslinking of the underlayer.

After the second (or pre-) baking operation S140 of the photoresist layer 15, the photoresist layer 15 is selectively exposed to actinic radiation 45/97 (see FIGS. 3A and 3B) in operation S150. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the actinic radiation is an electron beam.

Figure 3A:
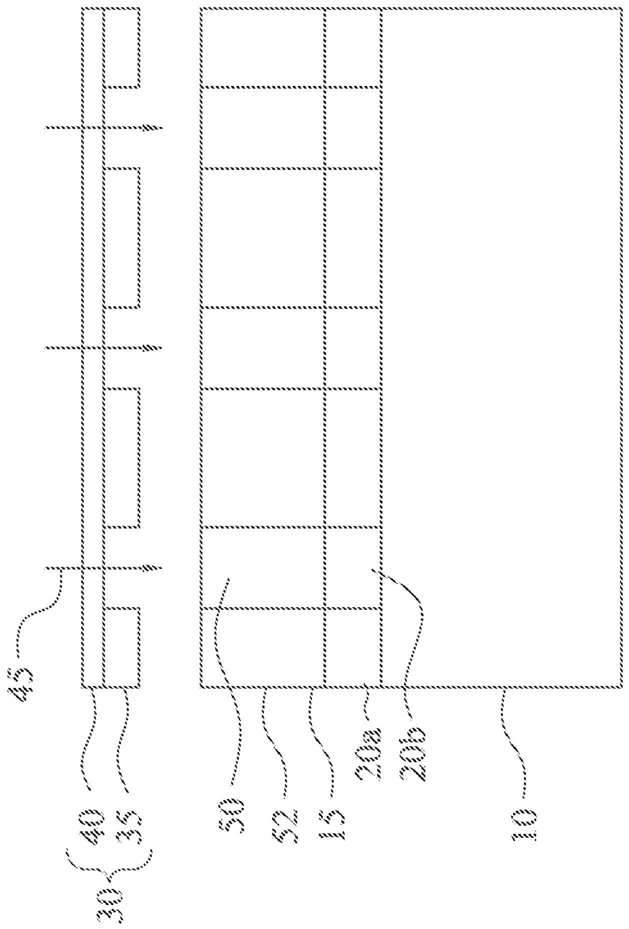
FIGS. 3A and 3B show a process stage of a sequential operation according to embodiments of the disclosure.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
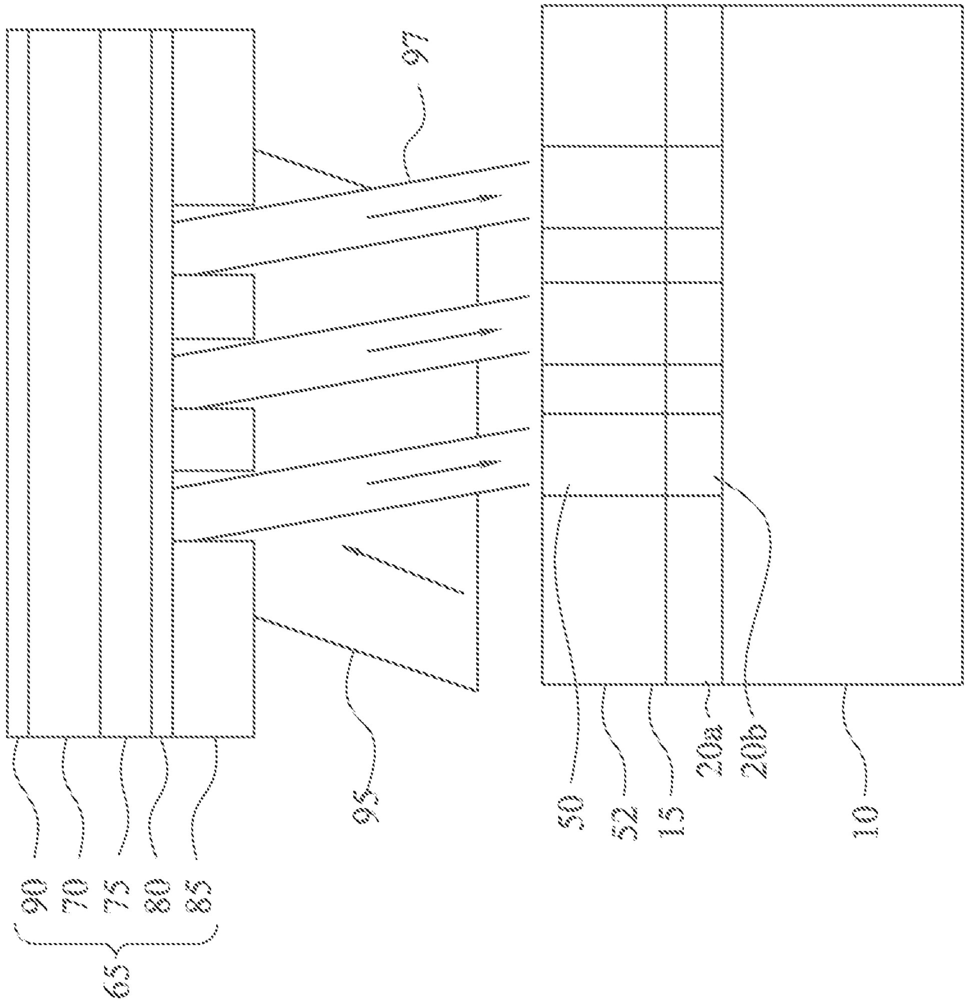

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber layer 85 is absorbed by the photomask. In some embodiments, additional optics, including mirrors, are between the reflective photomask 65 and the photoresist coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction. In addition to causing the chemical reaction in the photoresist layer 15, a portion of the radiation 45/97 also passes through the photoresist layer 15 and causes a reaction in the resist underlayer 20. Portions of the resist underlayer exposed to the radiation **20*b* have a different glass transition temperature (Tg), density, or porosity than portions of the resist underlayer not exposed to the radiation 20*a* because of the radiation induced chemical reaction in the resist underlayer 20**.

Next, the photoresist layer 15 undergoes a third baking (or post-exposure bake (PEB)) in operation S160. In some embodiments, the photoresist layer 15 is heated at a temperature of about 50° C. and 160° C. for about 20 seconds to about 120 seconds. The post-exposure baking may be used in order to assist in the generating, dispersing, and reacting of the acid/base/free radical generated from the impingement of the radiation 45/97 upon the photoresist layer 15 during the exposure. Such assistance helps to create or enhance chemical reactions, which generate chemical differences between the exposed region 50 and the unexposed region 52 within the photoresist layer.

Figure 4:
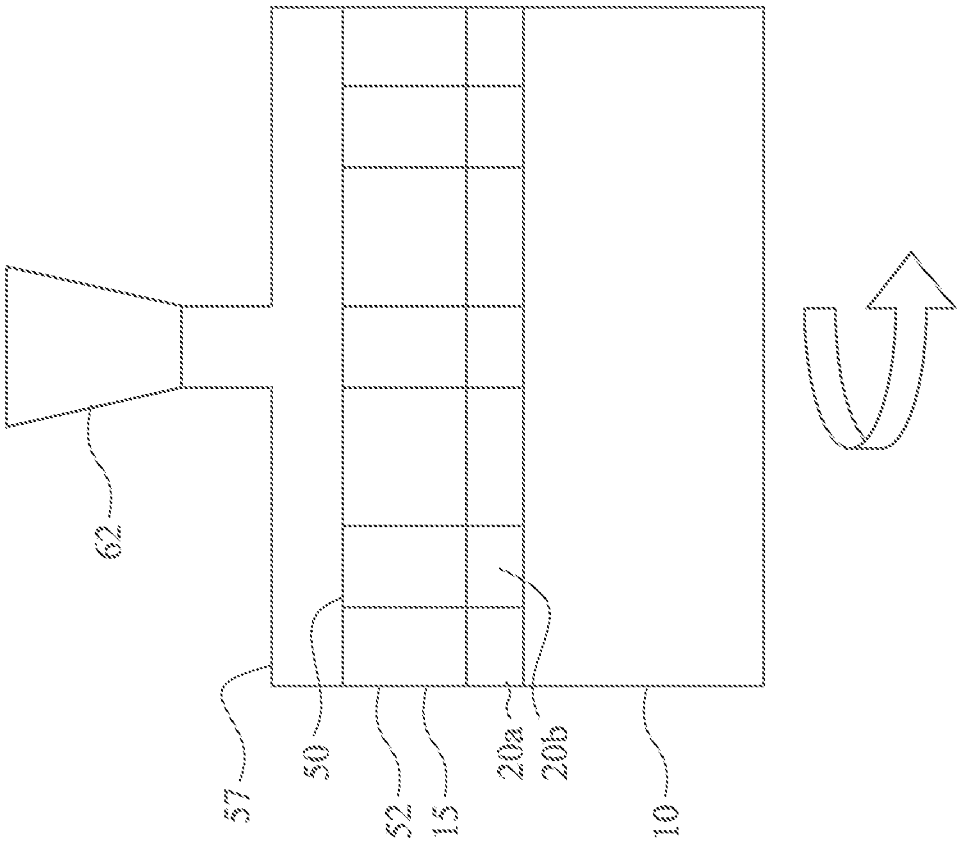
FIG. 4 shows a process stage of a sequential operation according to an embodiment of the disclosure.
Figure 5:
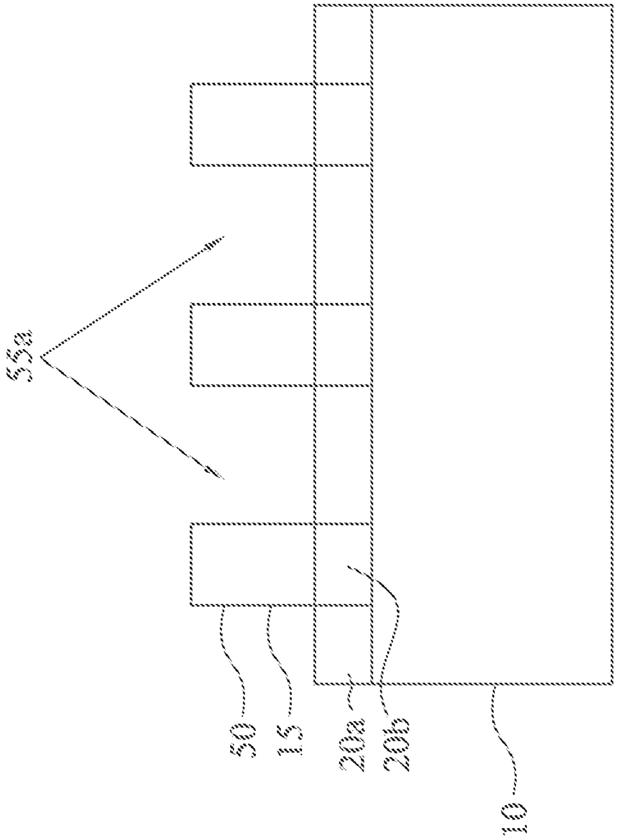
FIG. 5 shows a process stage of a sequential operation according to an embodiment of the disclosure.

The selectively exposed photoresist layer is subsequently developed by applying a developer to the selectively exposed photoresist layer in operation S170. As shown in FIG. 4, a developer 57 is supplied from a dispenser 62 to the photoresist layer 15. In some embodiments, the unexposed portion 52 of the photoresist layer is removed by the developer 57 forming a pattern of openings 55 in the photoresist layer 15 to expose the underlayer **20*a*, as shown in FIG. 5**.

Figure 6:
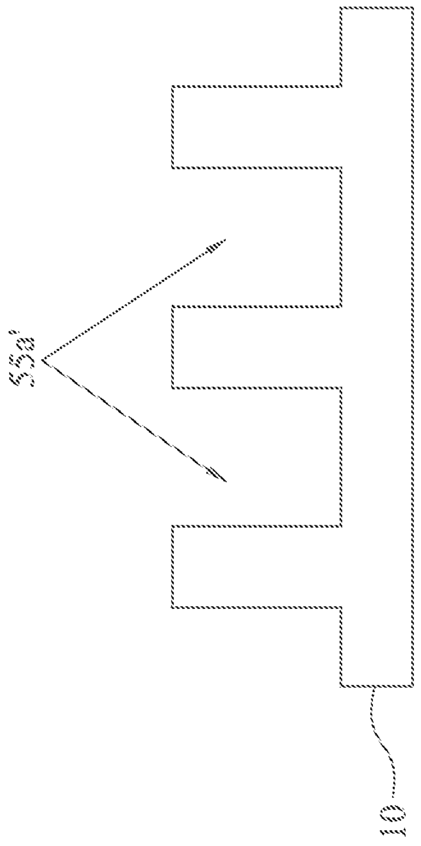
FIG. 6 shows a process stage of a sequential operation according to an embodiment of the disclosure.

In some embodiments, the pattern of openings 55 in the photoresist layer 15 are extended through the underlayer 20 into the layer to be patterned or substrate 10 to create a pattern of openings 55' in the substrate 10, thereby transferring the pattern in the photoresist layer 15 into the substrate 10, as shown in FIG. 6. The pattern is extended into the substrate by etching, using one or more suitable etchants. In some embodiments, the etching operation remove the portions of the underlayer **20*a* between the photoresist pattern features 50. The photoresist layer pattern 50 is at least partially removed during the etching operation in some embodiments. In other embodiments, the photoresist layer pattern 50 and the portion of the underlayer 20*b* under the photoresist layer pattern are removed after etching the substrate 10** by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to, Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal/nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

Resist underlayers are made of polymer compositions disposed between the resist layer and the substrate to improve the adhesion of the resist layer to the substrate in some embodiments. Embodiments of the present disclosure are directed to novel resist underlayers that allow control and tuning of glass transition temperature (Tg), density, or porosity of the resist underlayer. When the underlayer has a lower Tg than the post exposure bake temperature the exposed photoresist can infiltrate into the underlayer during the post exposure bake process leading to residue remaining in the developed area. On the other hand, when the underlayer has a higher Tg than the post exposure bake temperature, the pattern may collapse after development because of poor adhesion between the photoresist and the underlayer (surface property mismatch). While a higher Tg is desirable to limit infiltration, high Tg can result in pattern collapse. Therefore, it is desirable to control the Tg/density/porosity to achieve optimal results of inhibiting infiltration and pattern collapse. In some embodiments, the underlayer 20 is a bottom anti-reflective coating (BARC). In some embodiments, the BARC layer is an organic BARC, in other embodiments the BARC layer is an inorganic, such as a silicon-containing anti-reflective coating (SiARC) layer.

The underlayer according to embodiments of the disclosure has the ability to control the Tg/density/porosity contrast between actinic radiation exposed portions of the underlayer and unexposed portions of the underlayer. In some embodiments, the underlayer 20 is a polymer composition having a Tg higher than the post exposure bake (PEB) temperature. In some embodiments, the underlayer 20 has a Tg ranging from about 70° C. to about 220° C. The underlayer 20 is embedded with photocleavable functional group that provides the underlayer 20 a bond cleavage function at the exposed areas. The bond cleavage function helps to control the Tg/density/porosity. The Tg and density of the exposed area in the exposed areas is reduced and the porosity is in the exposed areas is increased, thereby improving the Tg/density/porosity contrast between the exposed areas and the non-exposed areas of the underlayer.

The underlayer photocleavable functional groups can be embedded in the underlayer polymer backbone (or main chain), underlayer polymer side chain, or a cross-linker. Regardless of the position of the photocleavable functional group, the differences in Tg, density, or porosity can be controlled by the amount of the cleavable functional group, which is embedded in the polymer and/or cross-linker, and the polymer molecular weight (MW). After exposure to actinic radiation, the underlayer Tg decreases, the density decreases, and the porosity increases in some embodiments. In some embodiments, the difference in Tg between actinic radiation exposed portions of the underlayer 20*b* and unexposed portions 20*a* ranges from about 1° C. to about 150° C. In some embodiments, the difference in Tg ranges from about 25° C. to about 100° C. In some embodiments, the difference in density between the actinic radiation exposed portions of the underlayer 20*b* and the unexposed portions ranges from about 0.1 $g/cm^3$ to about 1 $g/cm^3$. In some embodiments, the difference in density ranges from about 0.2 $g/cm^3$ to about 0.8 $g/cm^3$. In some embodiments, the difference in porosity between the actinic radiation exposed portions of the underlayer 20*b* than the unexposed portions ranges from about 1 to about 50%. In some embodiments, the difference in porosity ranges from about 5 to about 35%. Tg, density, or porosity differences below the disclosed ranges may provide insufficient contrast between the actinic radiation exposed and unexposed portions and may result in an unacceptable level of pattern collapse. Tg, density, or porosity differences above the disclosed ranges may result in an unacceptable amount of scum.

Figure 7A:
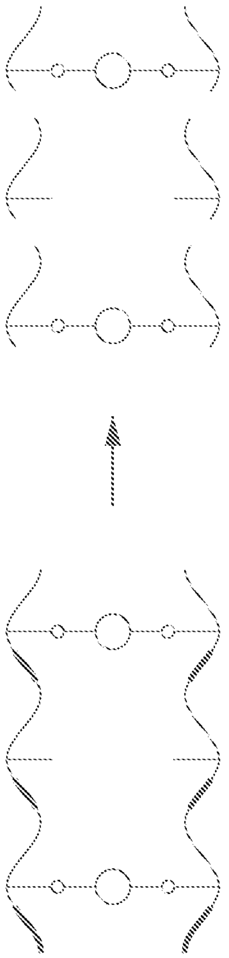
FIGS. 7A, 7B, 7C, and 7D illustrates polymers with photocleavable functional groups according to embodiments of the disclosure.
Figure 7B:
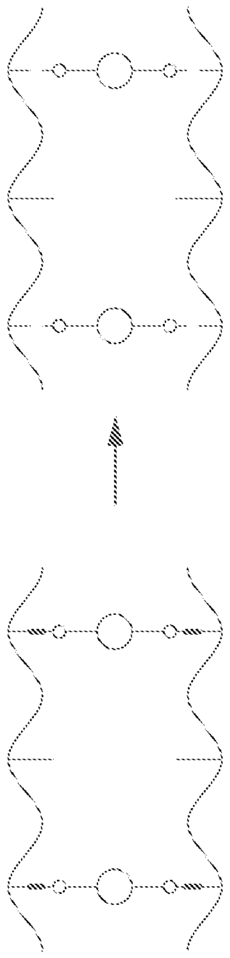
Figure 7C:
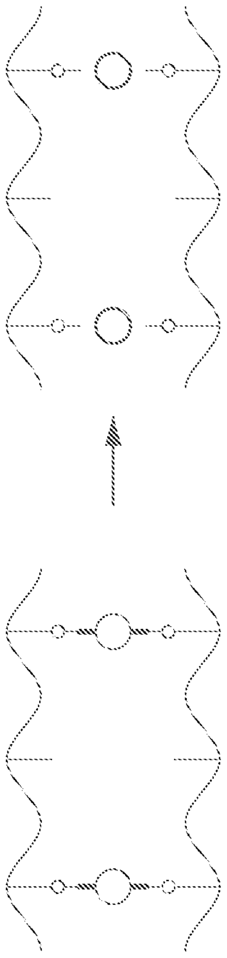
Figure 7D:
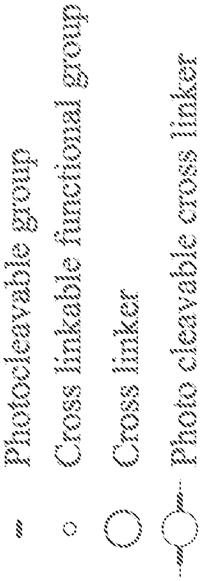

Embodiments of the present disclosure are illustrated in FIGS. 7A, 7B, 7C, and 7D, where FIG. 7D is the key to FIGS. 7A, 7B, and 7C. As shown in FIG. 7A, the photocleavable group is embedded in the backbone of the underlayer main polymer chain in some embodiments. In another embodiment, the photocleavable groups are embedded in the underlayer polymer side chains, as shown in FIG. 7B. FIG. 7C illustrates the embodiment where the photocleavable groups are embedded in the cross linker.

Figure 8A:
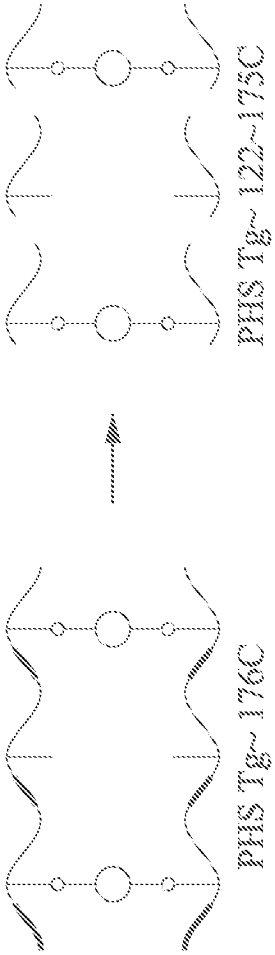
FIGS. 8A, 8B, 8C, 8D, 8F, and 8G illustrate polymers with photocleavable functional groups according to embodiments of the disclosure.
Figure 8B:
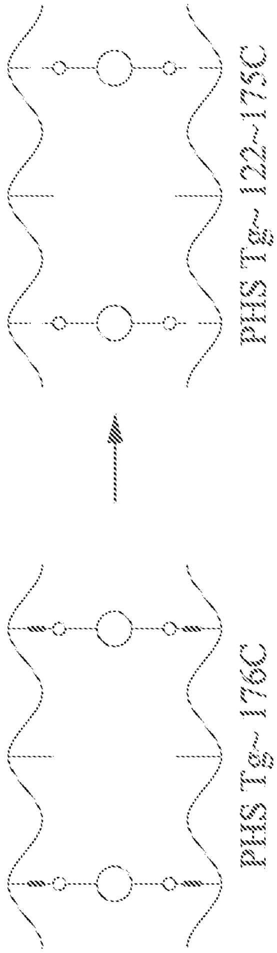
Figure 8C:
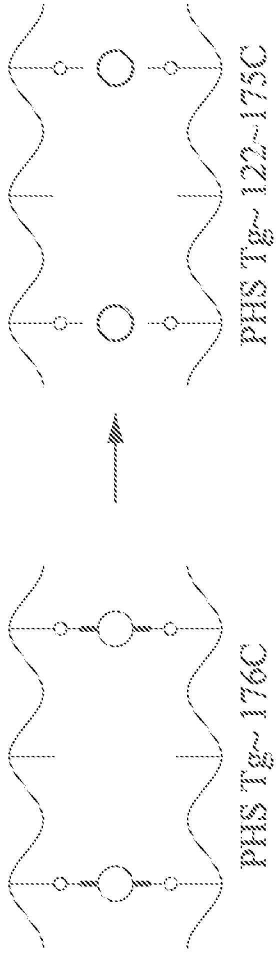
Figure 8D:
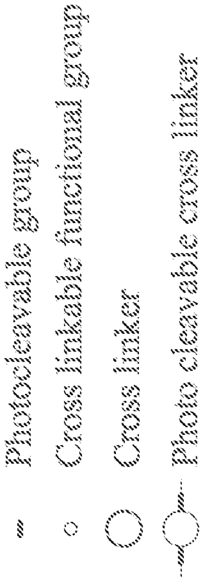

FIGS. 8A, 8B, and 8C illustrate the change in Tg of the underlayer polymer before and after cleavage of the photocleavable groups by irradiation with actinic radiation according to an embodiment. FIG. 8D is the key to FIGS. 8A, 8B, and 8C. In some embodiments, the actinic radiation is deep UV, such as a KrF or ArF laser irradiation. In other embodiments, the actinic radiation is extreme ultraviolet (EUV) radiation, or an electron beam. The polymer in FIGS. 8A, 8B, and 8C is a cross linked poly(4-hydroxystyrene) (PHS) in some embodiments. As shown in FIG. 8A, the photocleavable group is embedded in the backbone of the underlayer main polymer chain. Upon exposure to actinic radiation, the backbone of the polymer chain is cleaved and the Tg is reduced. In another embodiment, the photocleavable groups are embedded in the underlayer polymer side chains, as shown in FIG. 8B. Upon exposure to actinic radiation, the polymer side chain is cleaved and the Tg is reduced. FIG. 8C illustrates the embodiment where the photocleavable groups are embedded in the cross linker. Upon exposure to actinic radiation, the cross linker is cleaved and the Tg is reduced.

Figure 8F:
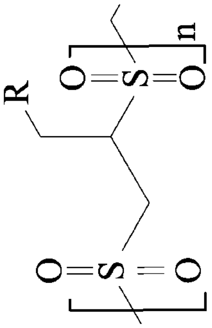

In some embodiments, the photocleavable group is a polycarbonate, in other embodiments, the photocleavable group is a polysulfone. FIG. 8F illustrates an example of a polysulfone having photocleavable groups according to an embodiment of the disclosure. Polycarbonates and polysulfones are cleaved when exposed to actinic radiation, such as deep UV, extreme UV, and electron beams. In some embodiments, different functional groups are used in the same underlayer polymer composition, such as using both polysulfone and polycarbonate functional groups, to tune the Tg, density, or porosity into a desired range. In some embodiments, the post exposure bake temperature and time are varied to adjust the Tg, density, or porosity of the underlayer.

Figure 8G:
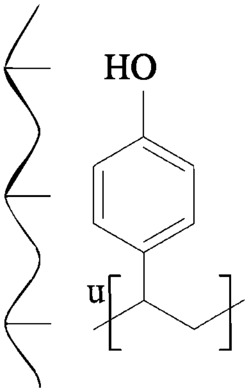

FIG. 8G shows the variation of Tg of poly(4-hydroxystyrene) (4-PHS) according to an embodiment with molecular weight. Cleaving the 4-PHS reduces the molecular weight and the Tg. The Tg can be controlled by the controlling the molecular weight. As the molecular weight decreases, the Tg starts decreasing from 176° C. to about 122° C. By controlling the amount of photocleavable groups in the crosslinked underlayer polymer, the Tg, density, or porosity of the underlayer can be controlled.

FIG. 9 illustrates some components of the underlayer composition according to some embodiments of the disclosure. In some embodiments, the underlayer composition includes an organic polymer, including, but not limited to polyhydroxystyrenes, polyacrylates, polymethacrylates, polyvinylphenols, polystyrenes, and copolymers thereof. In some embodiments, the organic polymer is a poly(4-hydroxystyrene), a poly(4-vinylphenol-co-methyl methacrylate) copolymer, and a poly(styrene)-b-poly(4-hydroxystyrene) copolymer, as illustrated in FIG. 9. In some embodiments, the underlayer composition includes, inorganic polymers, such as a polysiloxane and polysiloxane derivatives. In some embodiments, the polysiloxane derivatives include functional groups, such as epoxy groups, amine groups, or thiol groups. The photocleavable functional groups are used with both the organic and the inorganic underlayers in some embodiments. In some embodiments, photocleavable functional groups are oligomers or polymers with a number n of repeating units in the photocleavable functional groups ranging from about 2 to about 500. Above about 500 repeating units in the photocleavable group and the underlayer may suffer a decrease in performance.

In some embodiments, the underlayer 20 is formed by preparing an underlayer coating composition of a polymer and a cross linker in a solvent. The solvent can be any suitable solvent for dissolving the polymer and the cross linker. The underlayer coating composition is applied over a substrate 10 or layer to be patterned, such as by spin coating. Then the underlayer composition is baked to dry the underlayer and cross link the polymer, as explained herein in reference to FIG. 1.

In some embodiments, the thickness of the resist underlayer 20 ranges from about 2 nm to about 300 nm, and in other embodiments, the resist underlayer thickness ranges from about 20 nm to about 100 nm. In some embodiments, the thickness of the resist underlayer 20 ranges from about 40 nm to about 80 nm. Resist underlayer thicknesses less than the disclosed ranges may be insufficient to provide adequate photoresist adhesion and anti-reflective properties. Resist underlayer thicknesses greater than the disclosed ranges may be unnecessarily thick and may not provide further improvement in resist layer adhesion and scum reduction.

The cross linker may be any suitable cross linker. The cross linker reacts with a functional group on one of the main polymers and a functional group on another one of the main polymers in order to cross-link and bond the two main polymer chains together. This bonding and cross-linking increases the molecular weight of the polymer products of the cross-linking reaction and increases the overall density of the underlayer.

In some embodiments the cross linker has the following structure:

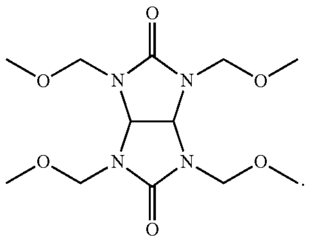

In other embodiments, the cross linker has the following structure:

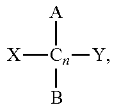

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

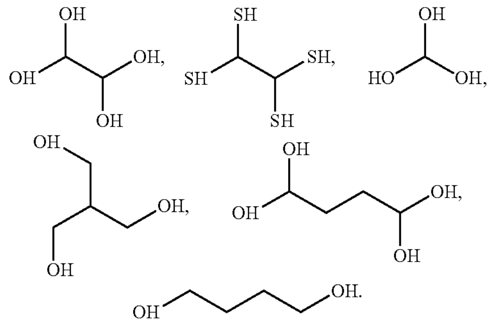

Alternatively, instead of or in addition to the cross linker being added to the photoresist composition, a coupling reagent is added in some embodiments, in which the coupling reagent is added in addition to the cross linker agent. The coupling reagent assists the cross-linking reaction by reacting with the functional groups on the polymer before the cross linker, allowing for a reduction in the reaction energy of the cross-linking reaction and an increase in the rate of reaction. The bonded coupling reagent then reacts with the cross linker agent, thereby coupling the cross-linker to the polymers.

In some embodiments, the coupling reagent has the following structure:

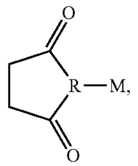

where R is a carbon atom, a nitrogen atom, a sulfur atom, or an oxygen atom; M includes a chlorine atom, a bromine atom, an iodine atom, —$NO_2$; —$SO_3$—; —H—; —CN; —NCO, —OCN; —$CO_2$—; —OH; —OR*, —OC(O)CR*; —SR, —$SO_2N(R^*)_2$; —$SO_2R^*$; SOR; —OC(O)R*; —C(O)OR*; —C(O)R*; —$Si(OR^*)_3$; —$Si(R^*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

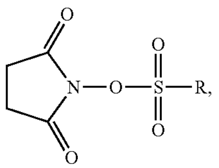

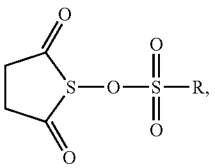

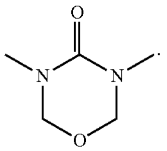

In some embodiments, the photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, resist compositions according to embodiments of the disclosure, such as a photoresist, include a polymer or a polymerizable monomer or oligomer along with one or more photoactive compounds (PACs). In some embodiments, the concentration of the polymer, monomer, or oligomer ranges from about 1 wt. % to about 75 wt. % based on the total weight of the resist composition. In other embodiments, the concentration of the polymer, monomer, or oligomer ranges from about 5 wt. % to about 50 wt. %. At concentrations of the polymer, monomer, or oligomer below the disclosed ranges the polymer, monomer, or oligomer has negligible effect on the resist performance. At concentrations above the disclosed ranges, there is no substantial improvement in resist performance or there is degradation in the formation of consistent resist layers.

In some embodiments, the polymerizable monomer or oligomer includes an acrylic acid, an acrylate, a hydroxystyrene, or an alkylene. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the polymer is a polyhydroxystyrene, a polymethyl methacrylate, or a polyhydroxystyrene-t-butyl acrylate, e.g.—

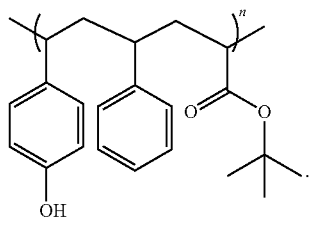

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like.

In some embodiments, such as when EUV radiation is used, the photoresist compositions according to the present disclosure are metal-containing resists. The metal-containing resists include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof. In some embodiments, the metal particles include one or more selected from the group consisting of Ce, Ba, La, Ce, In, Sn, Ag, Sb, and oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a ligand, wherein the ligand includes branched or unbranched, cyclic or non-cyclic, saturated organic groups, including C1-C7 alkyl groups or C1-C7 fluoroalkyl groups. The C1-C7 alkyl groups or C1-C7 fluoroalkyl groups include one or more substituents selected from the group consisting of $—CF_3$, —SH, —OH, =O, —S—, —P—, $—PO_2$, —C(=O)SH, —C(=O)OH, —C(=O)O—, —O—, —N—, —C(=O)NH, $—SO_2OH$, $—SO_2SH$, —SOH, and $—SO_2—$. In some embodiments, the ligand includes one or more substituents selected from the group consisting of $—CF_3$, —OH, —SH, and —C(=O)OH substituents.

In some embodiments, the ligand is a carboxylic acid or sulfonic acid ligand. For example, in some embodiments, the ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, each metal particle is complexed by 1 to 25 ligand units. In some embodiments, each metal particle is complexed by 3 to 18 ligand units.

In some embodiments, the resist composition includes about 0.1 wt. % to about 20 wt. % of the ligands based on the total weight of the resist composition. In some embodiments, the resist includes about 1 wt. % to about 10 wt. % of the ligands. In some embodiments, the ligand concentration is about 10 wt. % to about 40 wt. % based on the weight of the metal particles and the weight of the ligands. Below about 10 wt. %, ligand, the organometallic photoresist does not function well. Above about 40 wt. %, ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

In some embodiments, the copolymers and the PACs, along with any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

The solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), 7-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

Some embodiments of the photoresist include one or more photoactive compounds (PACs). The PACs are photoactive components, such as photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross linker is added to the photoresist. The cross linker reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross linker has the following structure:

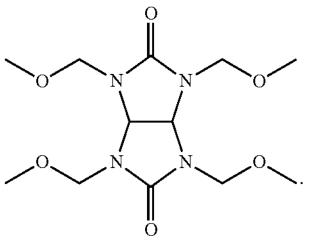

In other embodiments, the cross-linking agent has the following structure:

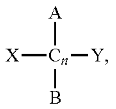

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross linker include the following:

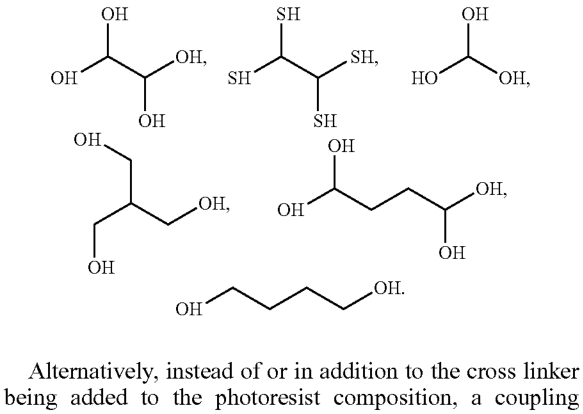

Alternatively, instead of or in addition to the cross linker being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross linker to the polymer resin.

Alternatively, in some embodiments in which the coupling reagent is added to the photoresist composition without the cross linker, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross linker, does not remain as part of the polymer, and only assists in bonding one hydrocarbon structure directly to another hydrocarbon structure.

In some embodiments, the coupling reagent has the following structure:

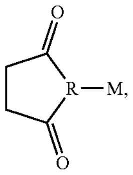

where R is a carbon atom, a nitrogen atom, a sulfur atom, or an oxygen atom; M includes a chlorine atom, a bromine atom, an iodine atom, $—NO_2$; $—SO_3—$; —H—; —CN; —NCO, —OCN; $—CO_2—$; —OH; —OR*, —OC(O)CR*; —SR, $—SO_2N(R^*)_2$; $—SO_2R^*$; SOR; —OC(O)R*; —C(O)OR*; —C(O)R*; $—Si(OR^*)_3$; $—Si(R^*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

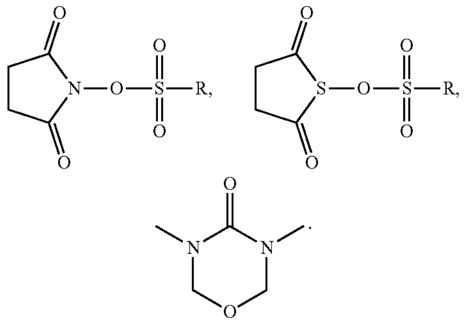

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as the PACs. In some embodiments, the solvent is chosen such that the polymer resin and the PACs can be evenly dissolved into the solvent and dispensed upon the layer to be patterned.

In some embodiments, a quencher is added to the photoresist in some embodiments to inhibit diffusion of the generated acids/bases/free radicals within the photoresist. The quencher improves the resist pattern configuration as well as the stability of the photoresist over time.

Another additive added to the photoresist in some embodiments is a stabilizer, which assists in preventing undesired diffusion of the acids generated during exposure of the photoresist.

Another additive added to the photoresist in some embodiments is a dissolution inhibitor to help control dissolution of the photoresist during development.

A coloring agent is another additive added to the photoresist in some embodiments of the photoresist. The coloring agent observers examine the photoresist and find any defects that may need to be remedied prior to further processing.

Surface leveling agents are added to the photoresist in some embodiments to assist a top surface of the photoresist to be level, so that impinging light will not be adversely modified by an unlevel surface.

In some embodiments, the polymer resin and the PACs, along with any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

Once ready, the photoresist is applied onto the underlayer 20, as shown in FIG. 2, to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-exposure bake of the photoresist layer is performed in some embodiments to cure and dry the photoresist prior to radiation exposure (see FIG. 1). The curing and drying of the photoresist layer 15 removes the solvent component while leaving behind the photoresist polymer, the PACs, the cross linker, and the other chosen additives. In some embodiments, the pre-baking is performed at a temperature suitable to evaporate the solvent, such as between about 50° C. and 120° C., although the precise temperature depends upon the materials chosen for the photoresist. The pre-baking is performed for a time sufficient to cure and dry the photoresist layer, such as between about 10 seconds to about 10 minutes.

FIGS. 3A and 3B illustrate selective exposures of the photoresist layer 15 and underlayer to form exposed regions 50 and 20*b*, respectively, and unexposed regions 52 and 20*a*, respectively. In some embodiments, the exposure to radiation is carried out by placing the photoresist coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45, 97, such as ultraviolet light, to the photoresist layer 15 in order to induce a reaction of the PACs, which in turn reacts with the polymer resin to chemically alter those regions of the photoresist layer to which the radiation 45, 97 impinges, and to cleave the photocleavable groups in the underlayer 20. In some embodiments, the radiation is electromagnetic radiation, such as g-line (wavelength of about 436 nm), i-line (wavelength of about 365 nm), ultraviolet radiation, deep ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In an embodiment, the patterned radiation 97 is extreme ultraviolet light having a wavelength of about 13.5 nm, the PAC is a photoacid generator, and a cross linker is used. The patterned radiation 97 impinges upon the photoacid generator, and the photoacid generator absorbs the impinging patterned radiation 97. This absorption initiates the photoacid generator to generate a proton (e.g., a $H^+$ atom) within the photoresist layer 15. When the proton impacts the carboxylic acid group on the hydrocarbon structure, the proton reacts with the carboxylic acid group, chemically altering the carboxylic acid group and altering the properties of the polymer resin in general. The carboxylic acid group then reacts with the cross linker in some embodiments to cross-link with other polymer resins within the exposed region of the photoresist layer 15. In addition, the patterned radiation 97 impinges upon the photocleavable functional groups embedded in the underlayer polymer causing the underlayer polymer to cleave with accompanying decrease in molecular weight, glass transition temperature, and density, and increase in porosity.

After the photoresist layer 15 and underlayer 20 have been exposed to the exposure radiation 45/97, a post-exposure baking is performed in some embodiments to assist in the generating, dispersing, reacting of the acid/base/free radical generated from the impingement of the radiation 45/97 upon the PACs during the exposure by advancing a cross-linking reaction occurs in the exposed areas of the photoresist layer, and the cleaving of the photocleavable functional groups. In some embodiments, the post-exposure baking occurs at temperatures ranging from about 50° C. to about 160° C. for a period of between about 20 seconds and about 120 seconds.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-unexposed regions 52 of the cross-linked negative resist, exposing the surface of the underlayer 20, as shown in FIG. 5, and leaving behind well-defined exposed photoresist regions 50, having improved definition than provided by conventional negative photoresist photolithography.

After the developing operation S170, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 50 is in place. For example, an etching operation, using dry or wet etching, is performed in some embodiments, to transfer the pattern of the photoresist layer 50 through the underlayer 20 to the underlying substrate 10, forming recesses 55' as shown in FIG. 6. The underlayer 20 and the substrate 10 have a different etch resistance than the photoresist layer 15. In some embodiments, the etchant is more selective to the underlayer 20 and substrate 10 than the photoresist layer 15. In some embodiments, a different etchant or etching parameters is used to etch the non-photocleaved portions of the underlayer 20*a* than to etch the substrate 10.

In some embodiments, a layer to be patterned 60 is disposed over the substrate prior to forming the underlayer 20, as shown in FIG. 10. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

The photoresist layer 15 and resist underlayer 20 are subsequently selectively exposed to actinic radiation 45/97 to form exposed regions 50 and 20*b* and unexposed regions 52 and 20*a*, in the photoresist layer and underlayer, respectively, as shown in FIGS. 11A and 11B, and described herein in relation to FIGS. 3A and 3B. As explained herein the photoresist is a negative photoresist, wherein polymer crosslinking occurs in the exposed regions 50 in some embodiments.

As shown in FIG. 12, the unexposed photoresist regions 52 are developed by dispensing developer 57 from a dispenser 62 to form a pattern of photoresist openings 55, as shown in FIG. 13. The development operation is similar to that explained with reference to FIGS. 4 and 5, herein.

Then as shown in FIG. 14, the pattern 55 in the photoresist layer 15 is transferred through the unexposed portion of the resist underlayer 20*a* to the layer to be patterned 60 using an etching operation and the photoresist layer 15 and exposed portion of the resist underlayer 20*b* are removed, as explained with reference to FIG. 6 to form pattern 55" in the layer to be patterned 60.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof are formed, according to embodiments of the disclosure.

The novel underlayer compositions and semiconductor device manufacturing methods according to the present disclosure provide higher semiconductor device feature resolution and density at higher wafer exposure throughput with reduced defects in a higher efficiency process than conventional exposure techniques. Embodiments of the disclosure provide improved adhesion of the photoresist pattern to the substrate thereby preventing pattern collapse while preventing pattern scum.

An embodiment of the disclosure is a method of manufacturing a semiconductor device, including forming a photoresist underlayer over a semiconductor substrate. The underlayer includes a main polymer having a photocleavable functional group. A photoresist layer is formed over the underlayer. The photoresist layer is selectively exposed to actinic radiation, and the selectively exposed photoresist layer is developed to form a photoresist pattern. In an embodiment, the selectively exposing the photoresist to actinic radiation cleaves the photocleavable functional group in the underlayer. In an embodiment, the selectively exposing the photoresist to actinic radiation adjusts a glass transition temperature (Tg), density, or porosity of the underlayer. In an embodiment, the photocleavable functional group is an oligomer or a polymer. In an embodiment, a number of repeating units of the photocleavable functional group ranges from 2 to 500. In an embodiment, the photocleavable functional groups are embedded in a backbone of the main polymer, side chain of the main polymer, or cross linker. In an embodiment, the underlayer is an organic polymer or an inorganic polymer. In an embodiment, the inorganic polymer is a polysiloxane. In an embodiment, the photocleavable functional group is a polycarbonate or a polysulfone.

Another embodiment of the disclosure is a method of manufacturing a semiconductor device, including forming a photoresist underlayer over a semiconductor substrate. The underlayer includes a main polymer. A photoresist layer is formed over the underlayer. The photoresist layer and underlayer to are selectively exposed to actinic radiation. A glass transition temperature (Tg) is decreased, a density is decreased, or a porosity is increased of a portion of the underlayer selectively exposed to the actinic radiation. The selectively exposed photoresist layer is developed to form a patterned photoresist layer. In an embodiment, a difference in Tg between exposed and unexposed portions of the underlayer ranges from 1° C. to 150° C. In an embodiment, a difference in density between exposed and unexposed portions of the underlayer ranges from 0.1 to 1 g/$cm^3$. In an embodiment, a difference in porosity between exposed and unexposed portions of the underlayer ranges from 1% to 50%. In an embodiment, the method includes heating the photoresist layer and the underlayer at a temperature ranging from 50° C. to 150° C. after the selectively exposing the photoresist layer and the underlayer to actinic radiation and before the developing the selectively exposed photoresist layer.

Another embodiment of the disclosure is a composition, including a polymer, including: a first main polymer chain, a second main polymer chain, and a photocleavable functional group. The first and second main polymer chains are linked by a cross linker. The first and second main polymer chains are one or more of a polyhydroxystyrene or an inorganic polymer. The photocleavable functional group is embedded in the first or second main polymer chains, embedded in a side chain of the first and second main polymer chains, or embedded in the cross linker. In an embodiment, the photocleavable functional group is an oligomer or a polymer. In an embodiment, a number of repeating units of the photocleavable functional group ranges from 2 to 500. In an embodiment, the inorganic polymer is a polysiloxane. In an embodiment, the photocleavable functional group is a polycarbonate or a polysulfone. In an embodiment, the linking polymer includes a plurality of different photocleavable functional groups.

Another embodiment of the disclosure is a method of manufacturing a semiconductor device, including forming a first layer over a semiconductor substrate. The first layer includes a main polymer, and first layer has a first glass transition temperature, first density, and first porosity. A resist layer is formed over the first layer. The first glass transition temperature is decreased to a second glass transition temperature, the first density is decreased to a second density, or the first porosity is increased to a second porosity of a first portion of the first layer. A first portion of the resist layer is removed. The remaining second portion of the resist layer after the removing the first portion of the resist layer overlies the first portion of the first layer having the second glass transition temperature, second density, or second porosity. In an embodiment, a difference in glass transition temperature between the first glass transition temperature and the second transition temperature of the first layer ranges from 1° C. to 150° C. In an embodiment, a difference in density between the first density and the second density of the first layer ranges from 0.1 to 1 g/$cm^3$. In an embodiment, a difference in porosity between the first porosity and the second porosity of the first layer ranges from 1% to 50%. In an embodiment, the main polymer is one or more of a polyhydroxystyrene or an inorganic polymer. In an embodiment, the inorganic polymer is a polysiloxane.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a photoresist underlayer over a semiconductor substrate, wherein the photoresist underlayer comprises a composition including:

a cross linker;

a main polymer; and a photocleavable functional group embedded in the cross linker, wherein the photocleavable functional group is a polycarbonate or a polysulfone, and the cross linker includes

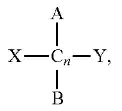

where C is carbon, n ranges from 1 to 15; A and B independently include a hydrogen atom, a hydroxyl group, a halide, an aromatic carbon ring, or a straight or cyclic alkyl, alkoxyl/fluoro, or alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, an isopropyl alcohol group, or an isopropyl amine group, except when n=1 then X and Y are bonded to a same carbon C;

forming a photoresist layer over the photoresist underlayer;

selectively exposing the photoresist layer to actinic radiation; and developing the selectively exposed photoresist layer to form a photoresist pattern.

2. The method according to claim 1, wherein the selectively exposing the photoresist to actinic radiation cleaves the photocleavable functional group in the photoresist underlayer.

3. The method according to claim 2, wherein the selectively exposing the photoresist to actinic radiation adjusts a glass transition temperature (Tg), density, or porosity of the photoresist underlayer.

4. The method according to claim 1, wherein the photocleavable functional group is an oligomer or a polymer.

5. The method according to claim 4, wherein a number of repeating units of the photocleavable functional group ranges from 2 to 500.

6. The method according to claim 1, wherein the main polymer is an inorganic polymer.

7. The method according to claim 1, wherein the main polymer is a polysiloxane.

8. A method of manufacturing a semiconductor device, comprising:

forming a photoresist underlayer over a semiconductor substrate, wherein the photoresist underlayer comprises:

a polymer;

a cross linker; and polycarbonate or polysulfone photocleavable functional groups, wherein the photocleavable functional groups are embedded in the cross linker, and the cross linker includes

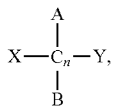

where C is carbon, n ranges from 1 to 15; A and B independently include a hydrogen atom, a hydroxyl group, a halide, an aromatic carbon ring, or a straight or cyclic alkyl, alkoxyl/fluoro, or alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, an isopropyl alcohol group, or an isopropyl amine group, except when n=1 then X and Y are bonded to a same carbon C;

forming a photoresist layer over the photoresist underlayer;

selectively exposing the photoresist layer and photoresist underlayer to actinic radiation;

decreasing a glass transition temperature (Tg), decreasing a density, or increasing a porosity of a portion of the photoresist underlayer selectively exposed to the actinic radiation by photocleaving the polycarbonate or polysulfone photocleavable functional group; and developing the selectively exposed photoresist layer to form a patterned photoresist layer.

9. The method according to claim 8, wherein the glass transition temperature decreases and a difference in Tg between exposed and unexposed portions of the photoresist underlayer ranges from 1° C. to 150° C.

10. The method according to claim 8, wherein the density decreases and a difference in density between exposed and unexposed portions of the photoresist underlayer ranges from 0.1 to 1 g/cm$^3$.

11. The method according to claim 8, wherein the porosity increases and a difference in porosity between exposed and unexposed portions of the photoresist underlayer ranges from 1% to 50%.

12. The method according to claim 8, further comprising heating the photoresist layer and the photoresist underlayer at a temperature ranging from 50° C. to 150° C. after the selectively exposing the photoresist layer and the photoresist underlayer to actinic radiation and before the developing the selectively exposed photoresist layer.

13. A method of manufacturing a semiconductor device, comprising:

forming a first layer over a semiconductor substrate, wherein the first layer comprises:

a cross linker;

a main polymer; and a polycarbonate or polysulfone photocleavable functional group embedded in the cross linker, wherein the cross linker includes

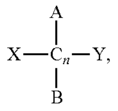

where C is carbon, n ranges from 1 to 15; A and B independently include a hydrogen atom, a hydroxyl group, a halide, an aromatic carbon ring, or a straight or cyclic alkyl, alkoxyl/fluoro, or alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, an isopropyl alcohol group, or an isopropyl amine group, except when n=1 then X and Y are bonded to a same carbon C, and the first layer has a first glass transition temperature, first density, and first porosity;

forming a resist layer over the first layer;

decreasing the first glass transition temperature to a second glass transition temperature, decreasing the first density to a second density, or increasing the first porosity of a first portion of the first layer to a second porosity by photocleaving the polycarbonate or polysulfone photocleavable functional group; and removing a first portion of the resist layer, wherein a remaining second portion of the resist layer after the removing the first portion of the resist layer overlies the first portion of the first layer having the second glass transition temperature, second density, or second porosity.

14. The method according to claim 13, wherein the glass transition temperature decreases and a difference in glass transition temperature between the first glass transition temperature and the second glass transition temperature of the first layer ranges from 1° C. to 150° C.

15. The method according to claim 13, wherein the density decreases and a difference in density between the first density and the second density of the first layer ranges from 0.1 to 1 g/cm$^3$.

16. The method according to claim 13, wherein the porosity increases and a difference in porosity between the first porosity and the second porosity of the first layer ranges from 1% to 50%.

17. The method according to claim 13, wherein the main polymer is one or more of a polyhydroxystyrene or an inorganic polymer.

18. The method according to claim 13, wherein the main polymer is a polysiloxane.

19. The method according to claim 1, further comprising increasing a porosity of portions of the photoresist underlayer during the selectively exposing the photoresist layer to actinic radiation.

20. The method according to claim 1, further comprising decreasing a density of portions of the photoresist underlayer during the selectively exposing the photoresist layer to actinic radiation.

* * * * *